United States Patent
Liu

(10) Patent No.: US 6,664,009 B2
(45) Date of Patent: *Dec. 16, 2003

(54) METHOD AND APPARATUS FOR ALLOWING PHASE CONFLICTS IN PHASE SHIFTING MASK AND CHROMELESS PHASE EDGES

(75) Inventor: Hua-Yu Liu, Palo Alto, CA (US)

(73) Assignee: Numerical Technologies, Inc., Mountain View, CA (US)

(*) Notice: Subject to any disclaimer, the term of this patent is extended or adjusted under 35 U.S.C. 154(b) by 315 days.

This patent is subject to a terminal disclaimer.

(21) Appl. No.: 09/917,581

(22) Filed: Jul. 27, 2001

(65) Prior Publication Data

US 2003/0023401 A1 Jan. 30, 2003

(51) Int. Cl.$^7$ ................................................. G03F 9/00
(52) U.S. Cl. ................................ 430/5; 430/30; 716/19; 716/21
(58) Field of Search ......................... 430/5, 30; 716/19, 716/21

(56) References Cited

U.S. PATENT DOCUMENTS

| | | | |
|---|---|---|---|
| 4,037,918 A | 7/1977 | Kato | 350/3.5 |
| 4,456,371 A | 6/1984 | Lin | 355/71 |
| 5,302,477 A | 4/1994 | Dao et al. | 430/5 |

(List continued on next page.)

FOREIGN PATENT DOCUMENTS

| | | |
|---|---|---|
| DE | 195 45 163 A1 | 6/1996 |
| EP | 0 464 492 A1 | 1/1992 |
| EP | 0 653 679 A2 | 5/1995 |
| EP | 0 698 821 | 2/1996 |
| GB | 2333613 A | 7/1999 |
| JP | 62067547 | 3/1987 |
| JP | 2-140743 | 5/1990 |
| JP | 7-111528 | 2/1991 |
| JP | 6-67403 | 3/1994 |
| JP | 8-51068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1999 |
| WO | WO 01/23961 A1 | 4/2001 |
| WO | WO 02/03140 A1 | 1/2002 |
| WO | WO 02/073312 A1 | 9/2002 |

OTHER PUBLICATIONS

Schellenberg, F., et al., "Optimization of Real Phase Mask Performance", SPIE—11th Annual Symposium on Photomask Technology, vol. 1604, pp. 274–296, Sep. 25–27, 1991.

Cooke, M., "OPC/PSM Designs For Poly Gate Layers", European Semiconductor, vol. 22, No. 7, pp. 57–59, Jul. 2000.

(List continued on next page.)

Primary Examiner—Christopher G. Young
(74) Attorney, Agent, or Firm—Bever, Hoffman & Harms, LLP; Jeanette S. Harms

(57) ABSTRACT

Phase shifting layouts and masks with phase conflicts are described. The phase shifting layout defines light transmissive regions for use in defining selected features in a layer of material of an integrated circuit (IC). The phase shifting layout includes a phase conflict caused by two light transmissive regions that are out of phase with each other and which, without correction, would lead to the definition of an artifact in the layer of material. A corresponding mask adapted for use in conjunction with the phase shifting mask can ensure that the artifact is ultimately erased. The phase conflict is intentionally introduced into the phase shifting layout during phase assignment to permit all of the selected features to be defined using the phase shifting mask.

34 Claims, 8 Drawing Sheets

U.S. PATENT DOCUMENTS

| | | | |
|---|---|---|---|
| 5,308,741 A | 5/1994 | Kemp | 430/312 |
| 5,316,878 A | 5/1994 | Saito et al. | 430/5 |
| 5,324,600 A | 6/1994 | Jinbo et al. | 430/5 |
| 5,328,807 A | 7/1994 | Tanaka et al. | 430/311 |
| 5,334,542 A | 8/1994 | Saito et al. | 437/40 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,472,814 A | 12/1995 | Lin | 430/5 |
| 5,480,746 A | 1/1996 | Jinbo et al. | 430/5 |
| 5,496,666 A | 3/1996 | Chu et al. | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |
| 5,532,090 A | 7/1996 | Borodovsky | 430/5 |
| 5,537,648 A | 7/1996 | Liebmann et al. | 395/500 |
| 5,538,815 A | 7/1996 | Oi et al. | 430/5 |
| 5,539,568 A | 7/1996 | Lin et al. | 359/285 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,702,848 A | 12/1997 | Spence | 430/5 |
| 5,725,969 A | 3/1998 | Lee | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,827,623 A | 10/1998 | Ishida et al. | 430/5 |
| 5,858,580 A | 1/1999 | Wang et al. | 430/5 |
| 5,885,734 A | 3/1999 | Pierrat et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,004,702 A | 12/1999 | Lin | 430/5 |
| 6,010,807 A | 1/2000 | Lin | 430/5 |
| 6,057,063 A | 5/2000 | Liebmann et al. | 430/5 |
| 6,066,180 A | 5/2000 | Kim et al. | 716/19 |
| 6,077,630 A | 6/2000 | Pierrat | 430/5 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,420,074 B2 | 7/2002 | Wang et al. | 430/5 |
| 6,436,590 B2 | 8/2002 | Wang et al. | 430/5 |
| 2001/0000240 A1 | 4/2001 | Wang et al. | 430/5 |
| 2001/0028985 A1 | 10/2001 | Wang et al. | 430/5 |
| 2002/0083410 A1 | 6/2002 | Wu et al. | 716/19 |
| 2002/0122994 A1 | 9/2002 | Cote et al. | 430/5 |
| 2002/0127479 A1 | 9/2002 | Pierrat | 430/5 |
| 2002/0129327 A1 | 9/2002 | Pierrat et al. | 716/19 |
| 2002/0136964 A1 | 9/2002 | Pierrat | 430/5 |
| 2002/0142231 A1 | 10/2002 | Kling et al. | 430/5 |
| 2002/0142232 A1 | 10/2002 | Kling et al. | 430/5 |
| 2002/0144232 A1 | 10/2002 | Ma et al. | 716/21 |
| 2002/0152454 A1 | 10/2002 | Cote et al. | 716/21 |
| 2002/0155363 A1 | 10/2002 | Cote et al. | 430/5 |

OTHER PUBLICATIONS

Granik, Y., et al., "Sub–Resolution Process Windows And Yield Estimation Technique Based On Detailed Full–Chip CD Simulation", SPIE, vol. 4182, pp. 335–341 (2000).

Plat, M., et al., "The Impact of Optical Enhancement Techniques on the Mask Error Enhancement Funchtion (MEEF)", SPIE, vol. 4000, pp. 206–214, Mar. 1–3, 2000.

Mansuripur, M., et al., "Projection Photolithography", Optics & Photonics News 11, 17 pages, Feb. 2000.

Ackmann, P., et al., "Phase Shifting and Optical Proximity Corrections to Improve CD Control on Logic Devices in Manufacturing for Sub 0.35 um I–Line", Advance Micro Devices (8 pages).

Matsuoka, K., et al., "Application of Alternating Phase–Shifting Mask to 0.16um CMOS Logic Gate Patterns", Matsushita Electric Ind. Co., Ltd. (9 pages).

Spence, C., et al., "Detection of 60(degree) Phase Defects on Alternating PSMs", Advanced Micro Devices, KLA–Tencor, DuPont RTC (2 pages).

Sugawara, M., et al., "Defect Printability Study of Attenuated Phase–Shifting Masks for Specifying Inspection Sensitivity", Sony Corporation, Kanagawa, Japan (16 pages).

Schmidt, R., et al., "Impact of Coma on CD Control for Multiphase PSM Designs", AMD, ASML (11 pages).

Erdmann, A., "Topography Effects and Wave Abberations in Advanced PSM–Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., JSR Microelectronics, Inc. (10 pages).

Lin, B.J., "The Relative Importance of the Building Blocks for 193nm Optical Lithography", Linnovation, Inc. (12 pages).

McCallum, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1 Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, ARCH Chemicals, Finle Technologies, KLATencor Corp. (10 pages).

Ronse, K., et al., "Thin Film Interference Effects in Phase Shifting Masks Causing Phase and Transmittance Errors", IMEC (15 pages).

Rosenbluth, A., et al., "Optimum Mask and Source Patterns to Print a Given Shape", IBM (17 pages).

Sakata, M., et al., "A Novel Radiaion Sensitive Spin–on–Glass Convertible into SiO2 and the Simple Fabrication Process Using It", Oki Electric Industry Co. Ltd. (3 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1=-.3 Lithogrpahy", Canon Inc. (13 pages).

Vandenberghe, G., et al., "(Sub-)100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fujitsu Limited (11 pages).

Levenson, M., et al., "Improving Resolution in Photolithography with a Phase–Shifting Mask", IEEE, Transactions On Electron Devices, vol. ED–29, No. 12, pp. 1828–1836, Dec. 1982.

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

IBM, "Method to Produce Sizes in Openings in Photo Images Smaller Than Lithographic Minimum Size", IBM Technical Disclosure Bullentin, vol. 29, No. 3, p. 1328, Aug. 1986.

Terasawa, T., et al., "0.3–Micron Optical Lithography Using a Phase–Shifting Mask", SPIE Optical/Laser Microlithography II, vol. 1088, pp. 25–33, Mar. 1989.

Buraschi, M., et al., "Optical–Diffraction–Based Modulation of Photoresist Profile or Microlithography Applications," Optical Engineering, vol. 28, No. 6, pp. 654–658, Jun. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Jinbo, H., et al., "0.2um or Less i–Line Lithography by Phase–Shifting Mask Technology", IEEE, pp. 33.3.1–33.3.4 (1990).

Neureuther, A., "Modeling Phase Shifting Masks", SPIE, 10th Annual Symposium On Microlithography, vol. 1496, pp. 80–85 (1990).

Toh, K., et al., "Chromeless Phase–Shifted Masks: A New Approach to Phase–Shifting Masks", BACUS—Tenth Annual Symposium on Microlithography, Sep. 1990 (27 pages).

Yamanaka, T., et al., "A 5.9um2 Super Low Power SRAM Cell Using a New Phase–Shift Lithography", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990).

Watanabe, H., et al., "Transparent Phase Shifting Mask", IEDM, pp. 33.2.1–33.2.4 (1990).

Inokuchi, K., et al., "Sub–Quarter Micron Gate Fabrication Process Using Phase–Shifting–Mask for Microwave GaAs Devices", Extended Abstracts Of The 1991 Intl. Conference On Solid State Devices And Materials, Yokohama, Japan, pp.92–94 (1991).

Inokuchi, K., et al., "Sub–Quarter–Micron Gate Fabrication Process Using Phase–Shifting Mask for Microwave GaAs Devices", Japanese Journal Of Applied Physics, vol. 30, No. 12B, pp. 3818–3821, Dec. 1991.

Jinbo, H., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Burggraaf, P., "Four More Significant Japanese Advances in Phase Shifting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Asai, S., et al., "High Performance Optical Lithography Using a Separated Light Source", J. Vac. Sci. Technol. B, vol. 10, No. 6, pp. 3023–3026, Nov./Dec. 1992.

Jinbo, H., et al., "Application of Blind Method to Phase–Shifting Lithography", IEEE, 1992 Symposium On VLSI Technology Digest Of Technical Papers, pp. 112–113 (1992).

Ohtsuka, H., et al., "Phase Defect Repair Method for Alternating Phase Shift Masks Conjugate Twin–Shifter Method", Jpn. J. Appl. Phys., vol. 31, pp. 4143–4149 (1992).

Pierrat, C., et al., "Phase–Shifting Mask Topography Effects on Lithographic Image Quality", IEEE, pp. 3.3.1–3.3.4 (1992).

Watanabe, H., et al., "Detection and Printability of Shifter Defects in Phase–Shifting Masks II Defocus Characteristics", Jpn. J. Appl. Phys., vol. 31, pp. 4155–4160 (1992).

Burggraaf, P., "Lithography's Leading Edge, Part 1: Phase–Shift Technology and Part 2: I–Line and Beyond", Semiconductor International, pp. 43–47 and 52–56, Feb. 1992.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bullentin, vol. 34, No. 10B, pp. 360–361, Mar. 1992.

Brunner, T., et al., "170nm Gates Fabricated by Phase–Shift Mask and Top Anti–Reflector Process", SPIE, Optical/Laser Microlithography VI, Vo. 1927, pp. 182–189 (1993).

Brunner, T., "Rim Phase–Shift Mask Combined with Off–Axis Illumination: A Path to 0.5(lampda)/Numerical Aperture Geometries", Optical Engineering, vol. 32, No. 10, pp. 2337–2343, Oct. 1993.

Lin, B.J., "Phase–Shifting Masks Gain an Edge", IEEE Circuits & Devices, pp. 28–35, Mar. 1993.

Liu, H.Y., et al., "Fabrication of 0.1um T–Shaped Gates by Phase–Shifting Optical Lithography", SPIE, Optical/Laser Microlithography VI, vol. 1927, pp. 42–52 (1993).

Nistler, J., et al., "Phase Shift Mask Defect Printability Analysis", Proceedings Of The Microlithography Seminar INTERFACE '93, OCG Microelectronic Materials, Inc., pp. 11–28 (1993).

Rieger, M., et al., "System for Lithography Proximity Compensation", Precim Company, Portland, Oregon, Sep. 1993 (28 pages).

Ronse, K., et al., "Comparison of Various Phase Shift Strategies and Application to 0.35um ASIC Designs", SPIE—Optical/Laser Microlithography VI, vol. 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al., "Phase–Shifting Lithography: Mask-making and its Application", J. Vac. Sci. Technol. B, vol. 11, No. 6, pp. 2669–2674, Nov./Dec. 1993.

Galan, G., et al., "Application of Alternating–Type Phase Shift Mask to Polysilicon Level for Random Logic Circuits", Jpn. J. Appl. Phys., vol. 33, pp. 6779–6784 (1994).

Mizuno, F., et al., "Practical Phase–Shifting Mask Technology for 0.3um Large Scale Integrations", J. Vac. Sci. Technol. B, vol. 12, No. 6, pp. 3799–3803, Nov./Dec. 1994.

Nistler, J., et al., "Large Area Optical Design Rule Checker for Logic PSM Application", SPIE, Photomask And X–Ray Mask Technology, vol. 2254, pp. 78–92 (1994).

Pati, Y.C., et al., "Phase–Shifting Masks for Microlithography: Automated Design and Mask Requirements", J. Opt. Soc. Am., vol. 11, No. 9, pp. 2438–2452, Sep. 1994.

Pierrat, C., et al., "A Rule–Based Approach to E–Beam and Process–Induced Proximity Effect Correction for Phase–Shifting Mask Fabrication", SPIE, vol. 2194, pp. 298–309 (1994).

Spence, C., et al., "Automated Determination of CAD Layout Failures Through Focus: Experiment and Simulation", SPIE, vol. 2197, pp. 302–313 (1994).

Stirniman, J., et al., "Wafer Proximity Correction and Its Impact on Mask–Making", Bacus News, vol. 10, Issue 1, pp. 1, 3–7, 10–12, Jan. 1994.

Waas, T., et al., "Automatic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design", SPIE, Vo. 2440, pp. 192–206, Feb. 1995.

Karklin, L., "A Comprehensive Simulation Study of the Photomask Defects Printability", SPIE, vol. 2621, pp. 490–504 (1995).

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishiwata, N., et al., "Novel Alternating Phase Shift Mask with Improved Phase Accuracy", SPIE, Proceedings Of The 17th Annual Symposium On Photomask Technology And Management, vol. 3236, pp. 243–249 (1997).

Morimoto, H., et al., "Next Generation Mask Strategy—Technologies are Ready for Mass Production of 256M DRAM?", SPIE, vol. 3236, pp. 188–189 (1997).

Roman, B., et al., "Implications of Device Processing on Photomask CD Requirements", SPIE, vol. 3236 (1997) (Abstract Only).

Ishida, S., et al., "Large Assist Feature Phase–Shift Mask for Sub–Quarter Micrometer Window Pattern Formation", SPIE, vol. 3096, pp. 333–343 (1997).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Petersen, J., et al., "Designing Dual–Trench Alternating Phase–Shift Masks for 140nm and Smaller Features Using 248–nm KrF and 193–nm ArF Lithography", Bacus News, vol. 14, Issue 8, pp. 1 & 4–13, Aug. 1998.

Fukuda, H., et al., "Determination of High–Order Lens Aberration Using Phase/Amplitude Linear Algebra", J. Vac. Sci. Technol. B, vol. 17, No. 6, pp. 3318–3321, Nov./Dec. 1999.

Fukuda, H., "Node–Connection/Quantum Phase–Shifting Mask: Path to Below 0.3um Pitch, Proximity Effect Free, Random Interconnects and Memory Patterning", J. Vac. Sci. Technol. B, vol. 17, No. 6, pp. 3291–3295, Nov./Dec. 1999.

Spence, C., et al., "Integration of Optical Proximity Correction Strategies in Strong Phase Shifters Design for Poly–Gate Layers", Bacus News, vol. 15, Issue 12, pp. 1, 4–13, Dec. 1999.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun. 2, 2000.

Pierrat, C., "Investigation of Proximity Effects in Alternating Aperture Phase Shifting Masks", Numerical Technologies, Inc. (11 pages).

Cote, M., et al., "A Practical Application of Full–Feature Alternating Phase–Shifting Technology for a Phase–Aware Standard–Cell Design Flow", Numerical Technologies Inc. (6 pages).

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

Wang, R., et al., "Plarized Phase Shift Mask: Concept, Design, and Potential Advantages to Photolithography Process and Physical Design", Motorola Semiconductor Product Sector (12 pages).

Ogawa, K., et al., "Phase Defect Inspection by Differential Interference", Lasertec Corporation (12 pages).

Pistor, T., "Rigorous 3D Simulation of Phase Defects in Alternating Phase–Shifting Masks", Panoramic Technology Inc. (13 pages).

Semmler, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Hirai, Y., et al., "Automatic Pattern Generation System for Phase Shifting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Garofalo, J., et al., "Phase–Shifting Structures for Isolated Features", SPIE–Optical/Laser Microlithography IV, vol. 1463, pp. 151–166 (1991).

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Holscher, R., et al., "Response Surface Modeling of Rim Phase Shift Masks", SPIE—Optical/Laser Microlithography VI, vol. 1927, pp. 868–878 (1993).

Newmark, D., et al., "Aerial Image Based Design of Rim Phase–Shift Masks with Annular Illumination", SPIE—Optical/Laser Microlithography VI, vol. 1927, pp. 63–78 (1993).

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Ohnuma, H., et al., "Lithography Computer Aided Design Technology for Embedded Memory in Logic", Jpn. J. Appl. Phys., vol. 37, Part I, No. 12B, pp. 6686–6688, Dec. 1998.

Kikuchi, K., et al., "Method of Expanding Process Window for the Double Exposure Technique with alt–PSMs", Optical Microlithography XIII, Proceeding of SPIE, vol. 4000, pp. 121–131 (2000).

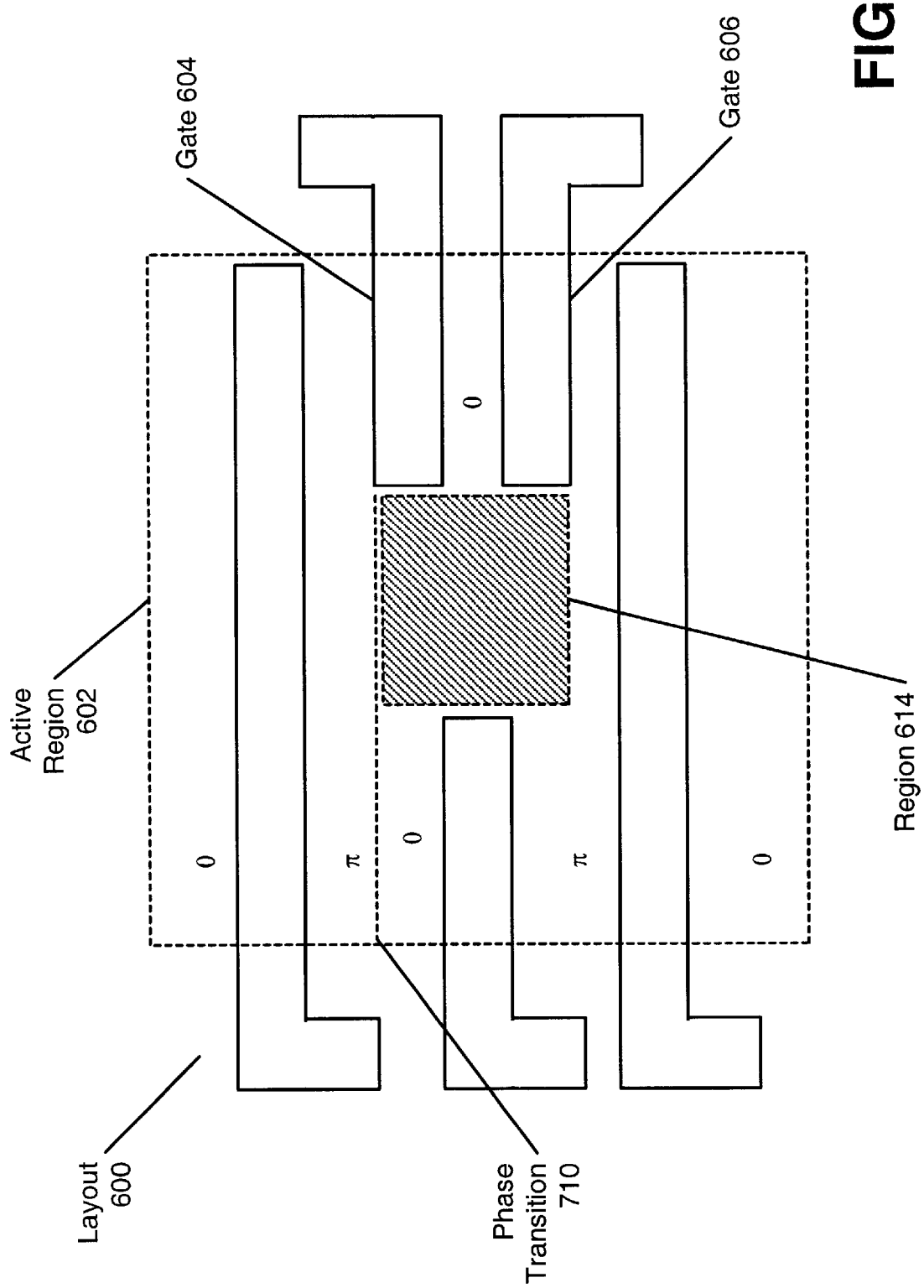

METHOD AND APPARATUS FOR ALLOWING PHASE CONFLICTS IN PHASE SHIFTING MASK AND CHROMELESS PHASE EDGES

BACKGROUND

1. Field of the Invention

This invention relates to the field of semiconductor devices. More particularly, the invention relates to a method and apparatus for allowing phase conflicts between phase shifting regions in a phase shifting mask to be used in optical lithography processes for manufacturing integrated circuit devices.

2. Description of the Related Art

Semiconductor devices continue to be produced at reduced sizes as optical lithography processes have evolved. Techniques such as phase shifting have been developed to assist in the production of subwavelength features on the integrated circuits (IC) using optical lithography processes. Subwavelength features are features that are smaller than the wavelength of light used to create circuit patterns in the silicon. More generally, phase shifting can be used to create features smaller than a minimum realizable dimension for the given process.

Through the use of phase shifting masks, such subwavelength features can be efficiently produced. (Note, that the term "mask" as used in this specification is meant to include the term "reticle.") One approach to producing a phase shifting mask (PSM) is to use destructive light interference caused by placing two, out of phase, light transmissive areas in close proximity in order to create an unexposed region on a photoresist layer of an IC. If that unexposed area is then protected from exposure when a binary mask is used to expose the remaining field (thus causing definition of the remaining structure), the resultant IC will include subwavelength features created by the PSM.

One approach to preparing an IC for production using PSMs is for one or more features of the IC to be identified for production using PSMs. For example, a designer might identify one or more particular features for production using the PSM, e.g. to define the identified gates (or other features) at subwavelength sizes.

A portion of a design layout 100 for a layer in an IC is shown in FIG. 1. Several distinct portions of the design layout are identified, particularly a gate 102 and a gate 104. In this example, both the gate 102 and the gate 104 are identified as "critical", e.g. to be produced using a phase shifting mask.

A phase shifting mask 200 for defining the gate 102 and the gate 104 is shown in FIG. 2. The phase shifting mask 200 includes three light transmissive regions: a light transmissive region 202, a light transmissive region 204, and a light transmissive region 206. Light transmissive region 202 and light transmission region 204 are out of phase with one another, e.g. light through one is at phase 0 and the light through the other at phase π. Similarly, light transmissive region 204 and light transmissive region 206 are out of phase with one another, continuing the example if the light transmissive region 204 is at phase π, then the light transmissive region 206 would be at phase 0. These light transmissive regions are sometimes referred to both individually and collectively as phase shifters (the meaning will be apparent from usage). Additionally, the light transmissive regions are sometimes referred to as phase shifting areas. Note that between the light transmissive regions there is some protect (usually chrome) that assists in the definition of feature size and improves mask manufacturability.

FIG. 2 also illustrates that it is generally preferable to make the phase shifters (e.g. the light transmissive region 202, the light transmissive region 204, and the light transmissive region 206) relatively wide compared to the wavelength of the light (λ). For example, some phase shifting processes attempt to make the total width of the phase shifters and the protective area between them approximately 3λ. In this example, due to the proximity of the gates, instead of having two separate light transmissive regions between the gate 102 and the gate 104, a single light transmissive region, the light transmissive region 204 is used.

If two light transmissive regions were used for the light transmissive region 204, they would be assigned the same phase to prevent definition of an artifact on the IC. Similarly, if the light transmissive region 202 had to be of phase π and the light transmissive region 206 had to be of phase 0 (for example because of surrounding phase shifters, etc.), then a phase assignment problem would arise with respect to assigning phase to the light transmissive region 204. For example, if the phase assigned is 0 then, the gate 104 would not be successfully defined. Further splitting the light transmissive region 204 into two parts would produce an undesirable artifact on the IC.

Accordingly, what is needed is a method and apparatus for allowing phase assignment conflicts between phase shifting regions in a phase shifting mask. Additionally, both a phase shifting mask with phase assignment conflicts and a complimentary binary mask that can produce ICs with subwavelength structures is desired.

Frequently, phase shifting masks use chrome (or other protective materials) between edges of two phase shifters to improve mask manufacturability and critical dimension control. However, the requirement of a chrome (or other protective) edge on the phase shifting mask may make definition of certain densely packed features extremely difficult.

Accordingly, what is needed is a method and apparatus for allowing chromeless (or, more generally, protectless) phase transitions in a phase shifting mask. Additionally, both a phase shifting mask with chromeless phase transitions and a complimentary binary mask that can produce ICs with subwavelength structures is desired.

SUMMARY

Phase shifting layouts and masks with phase conflicts are described. The phase shifting layout defines light transmissive regions for use in defining selected features in a layer of material of an integrated circuit (IC). The selected features are sometimes referred to as critical features. The selected features are simply those features within a given layout, or portion of a layout, that a designer has specified would be desirable to produce using phase shifting. The selected features can then be produced at subwavelength sizes and can be more densely packed.

If the selected features are in relatively close proximity to one another, it may be difficult to assign phase to each of the light transmissive regions in the phase shifting layout. That is because the light transmissive regions on opposite sides of a given feature must be of opposite phase. Some IC layouts may have the selected features in an arrangement that makes it impossible to assign phase to the light transmissive regions so that the selected features can all be defined.

By adding a phase transition (and optionally control chrome) to subdivide one or more the light transmissive regions, it may then be possible to assign phase to all of the light transmissive regions so that all of the selected features are defined by the phase shifting mask. However, the added phase transition introduces a (intentional) conflict that if used, without correction, would lead to the definition of an artifact, or simply a structure, in the layer of material. This phase conflict is sometimes referred to as a false phase conflict since allowing it the layout data does not prevent the resultant mask from being used to successfully define the selected features.

A corresponding mask for use in conjunction with the phase shifting layout that includes the false conflict can also be defined. In one embodiment, a binary trim mask is used. The corresponding mask is characterized by the fact that when used in conjunction with the phase shifting mask, the artifact created by the false phase conflict will not be produced in the layer of material. If a binary trim mask is used, this can be accomplished by ensuring that there is an absence of protect (usually chrome) in the area of the trim mask corresponding to the location of the false phase conflict on the phase shifting mask.

BRIEF DESCRIPTION OF THE FIGURES

FIG. 7 illustrates the layout of FIG. 6 overlaid with phase assignments after phase has been assigned to the phase conflict region.

DETAILED DESCRIPTION

Overview

Using embodiments of the invention, phase shifting masks that include certain phase conflicts (e.g. conflicts that, without further correction, would generate artifacts on the resultant IC) are selectively permitted. The result is that the phase assignment problem may be reduced in complexity because the problem can be further localized (introducing phase conflicts will break cycles that prevent coloring) and reduce the likelihood that the design must be redone.

First, the basic approach will be considered. Then, the selection process for permitting phase conflicts will be considered in greater detail. Finally, alternative embodiments of the invention will be described in greater detail.

Basic Approach

Figure 3:
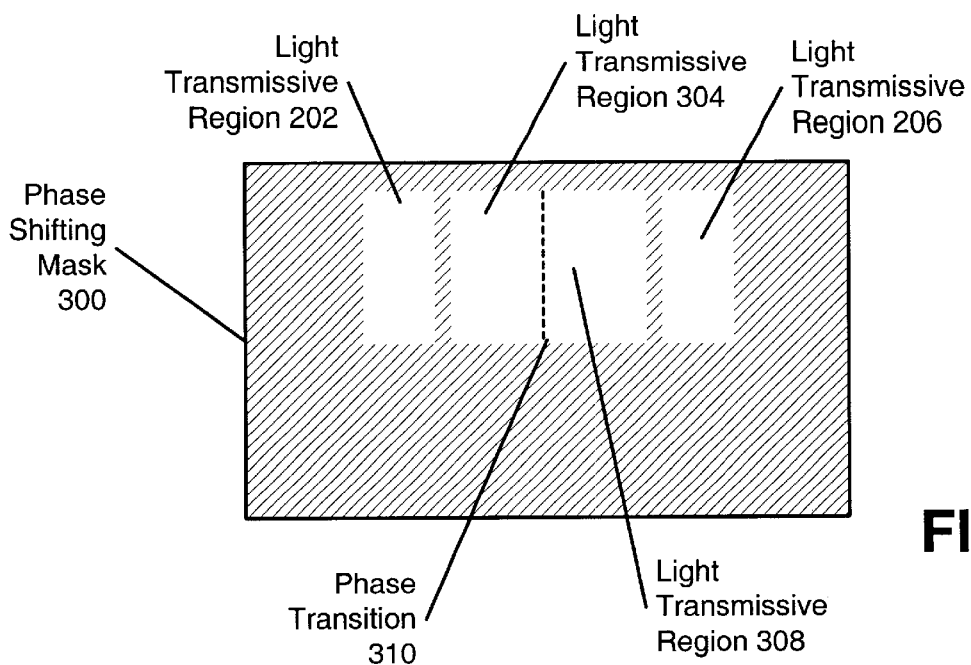
FIG. 3 illustrates a phase shifting mask that includes a phase assignment conflict to define the gates of the layout of FIG. 1.

The basic approach is to introduce (or permit) phase transitions that would produce artifacts on the IC if not corrected. Turning to FIG. 3, an alternative phase shifting mask 300 for the gates of the layout 100 is shown. Assuming that the light transmissive region 202 and the light transmissive region are of phase 0 and $\pi$, respectively, a phase transition 310 can be introduced dividing the light transmissive region 206 of the phase shifting mask 200 into two separate light transmissive regions: the light transmissive region 304 and the light transmissive region 308. Further, the regions will be assign phase $\pi$ and 0, respectively.

As noted, having the light transmissive region 304 and the light transmissive region 308 out of phase with one another will introduce an artifact between the two regions. Generally, this sort of transition would be unacceptable as part of phase assignment. However, the phase assignment rules are relaxed according to one embodiment of the invention to permit conflicts in areas where there is no structure in the layout, e.g. underneath the phase transition 310.

Also, note that in some embodiments, protect (usually chrome) can be placed between the light transmissive region 304 and the light transmissive region 308 to improve mask manufacturability and to better control the size of the resulting artifact (not shown).

Figure 4:
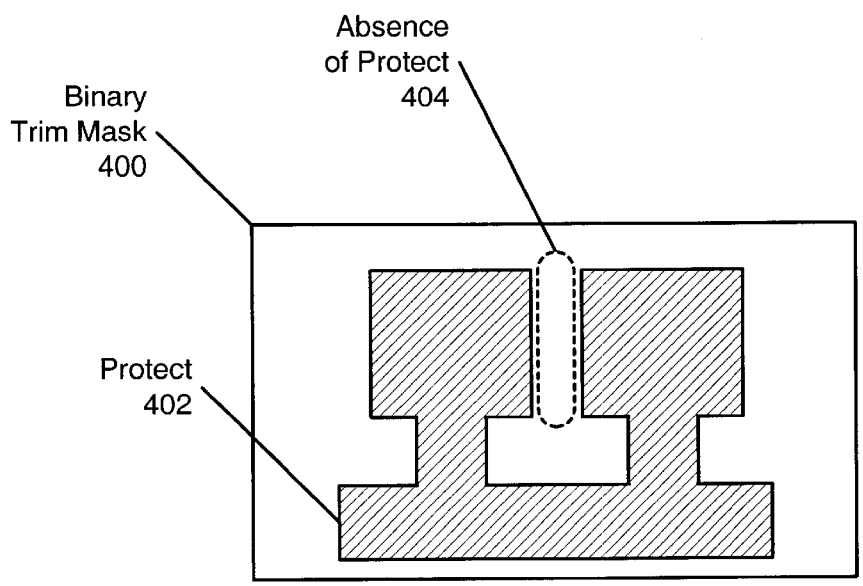
FIG. 4 illustrates a corresponding binary trim mask for the phase shifting mask of FIG. 3.

FIG. 4 illustrates a corresponding binary trim mask 400 for use with the phase shifting mask 300 of FIG. 3. The binary trim mask 400 includes a protect 402 that prevents exposure of the structures in the layout 100. The protect 402 is oversized around the gates to protect the gates that were defined using the phase shifting mask 300. Notably, there is an absence of protect 404 (dotted region) where the artifact from the phase conflict on the phase shifting mask 300 would appear. The absence of protect 404 allows the artifact to become exposed, and thus removed during the processing of the layer of the IC. In some embodiments, an attenuated binary trim mask is used as the binary trim mask 400.

Now, a more detailed process flow used by some embodiments of the invention will be described.

Process Flow

Figure 5:
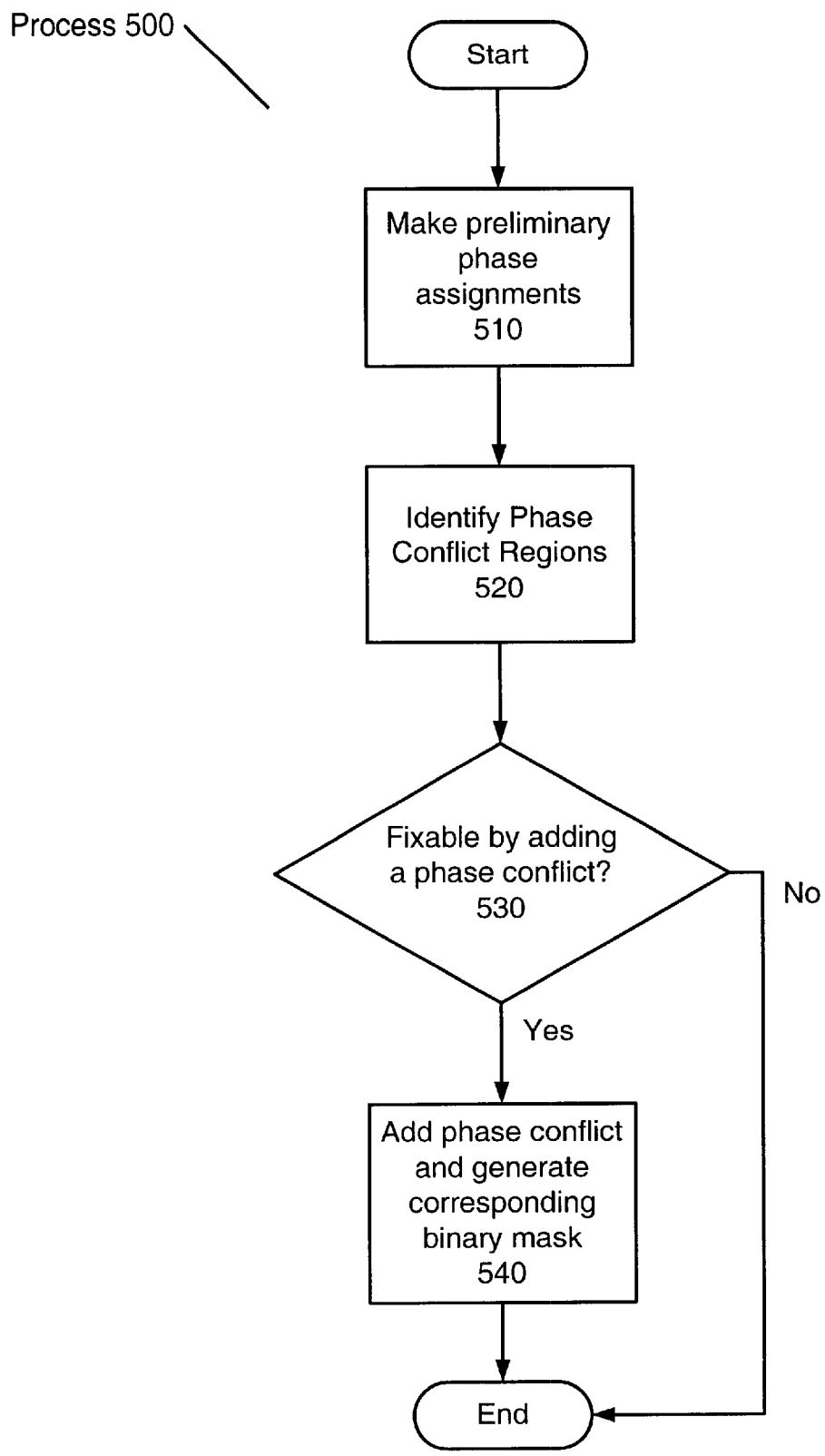
FIG. 5 is a process flow diagram for selectively allowing phase conflicts.

The process will now be described in greater detail with reference to FIG. 5. This process can be used to localize resolution of phase assignments for phase shifting masks. Using this approach reduces the likelihood that layouts will need to be redesigned to accommodate definition of structures in a layer of an IC using phase shifting masks.

Figure 6:
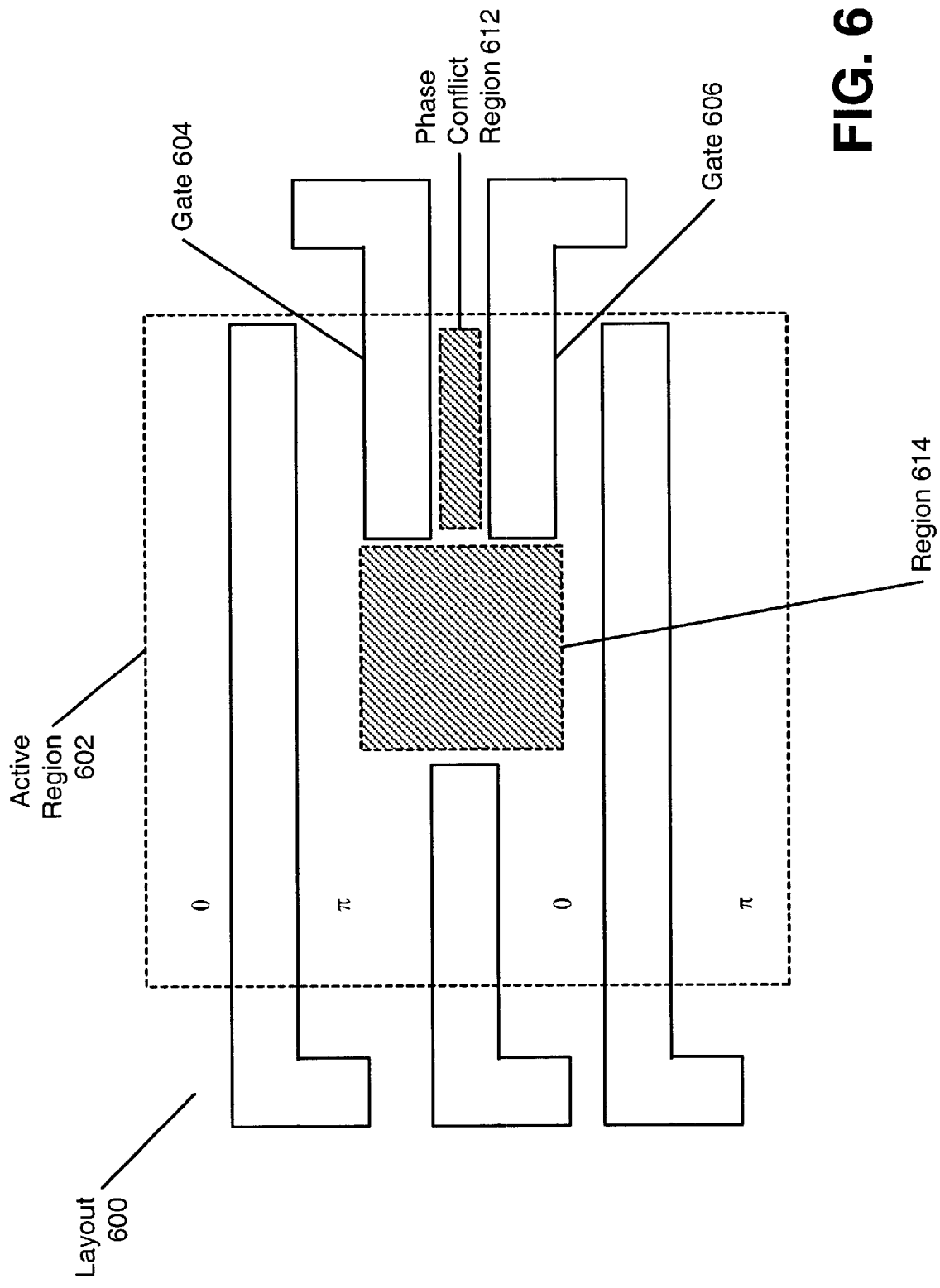
FIG. 6 illustrates a portion of a design layout for an IC overlaid with preliminary phase assignments and a phase conflict region.

The process 500 starts at step 510 with preliminary phase assignments. For example, the layout 600 in FIG. 6 shows five gates inside an active region 602 (shown with dotted lines). Included in the layout 600 is a gate 604 and a gate 606. Preliminary phase assignments where phase shifters will be placed are superimposed on the layout 600 as "0" and "$\pi$".

Next, at step 520, phase conflict regions can be identified. In FIG. 6, the preliminary assignment leaves a phase conflict region 612. If the phase conflict region 612 is assigned phase of 0 in a phase shifting mask then the gate 604 will not be defined by the phase shifting mask and similarly if assigned phase of $\pi$, the gate 606 will not be defined.

Also, the region 614 is shown since the assignment of phase to that region is not particularly important. In one embodiment, the region 614 will be opaque on the phase shifting mask. In another embodiment, the region 614 will be assigned a single phase, e.g. 0 or $\pi$. In a different embodiment, the region 614 may be subdivided into multiple regions with an assigned phase.

Then, at step 530, a determination is made as to whether the phase conflict regions, e.g. the phase conflict region 612, can be assigned phase by introducing a phase conflict. These added phase conflicts are sometimes referred to as "false" phase conflicts since the artifacts that they create can be wiped away. In some embodiments, the process will start at step 530 using input from another program that has performed preliminary phase assignment. False phase conflicts can be created by adding phase transitions to the (already placed) phase shifters. For example, FIG. 7 illustrates the layout 600 with a phase transition 710 added (shown as a dotted line). By adding the phase transition 710, the phase assignments can be changed and more particularly, the phase conflict region 612 can be assigned a phase. Also, note that adding the phase transition may cause the preliminary phase assignments to change. Cf. phase assignments of FIG. 6 and FIG. 7. For many standard cells, adding only a single extra phase transition will solve the phase assignment problem for a design.

In some instances, introduction of additional phase transitions may not be possible. For example, design rules, optical proximity limitations, mask manufacturability requirements, and/or other requirements may come into play. For example, in some embodiments, a minimum shifter width is $0.8\lambda$ for a $\lambda=248$ nm process. If this minimum width is used, then if the total width (or length) of the light transmissive region in the direction where the phase transition will be inserted is less than $1.6\lambda$, then a phase transition cannot be inserted. Similarly, if the protect of the binary trim mask could not be fabricated so as to tolerate mask misalignment (over sizing of protect around critical features) while also allowing exposure of the artifact from the added phase conflict, then the additional phase transition cannot be added.

Finally, at step 540 the false phase conflict(s) identified at step 530 is/are added to the phase shifting mask and the corresponding binary mask is adjusted as well (not shown). As seen in FIG. 3 and FIG. 4, the phase shifting mask will include the extra phase transitions (with or without protect between the added phase transitions) and the binary mask will have an absence of protect over the regions where the artifact from the false phase transition appears.

For some layouts, there may be multiple false phase conflicts that could be introduced to solve a particular phase assignment problem. For example, layout 600 could be defined by placing the phase transition 710 in the corresponding location relative to the gate 606 or by adding more than one phase transition. Some embodiments of the invention attempt to introduce the minimum number of false phase conflicts necessary to make phase assignment possible.

Generally, phase transitions will be introduced by considering one or more of the following criteria: largest phase shifting region, phase shifting region having greatest process latitude, and ease of removal of artifacts created by the phase transition. Thus, in this example, the location of the phase transition 710 was in part selected over other possible locations because it had high process latitude, was relatively large, and easy to erase. The specific ranking of the selection criteria may be user controllable.

Accordingly a general approach for resolving phase assignment conflicts by introducing false phase conflicts has been described. The approach allows for highly localized solutions to phase assignment conflicts without the need to change the layout and/or define critical features without the use of phase shifting. (Recall that critical features are those features identified as to be produced using phase shifting, e.g. manually by the designer and/or in some sort of automated fashion.)

Chromeless Phase Transitions

The discussion in this section will refer to a phase transition boundary as being chromeless, in reference to current common mask fabrication technologies. More generally, the term chromeless in the context of this application refers to a phase shifting mask lacking a radiation/light protective region between the two (or more) light transmissive regions. The usage of the term will be apparent from the following discussion.

First some motivations for using the chromeless phase transitions will be discussed then some examples of the use of the same will be considered.

Specifically, the minimum allowable distance allowed between two shifters with opposite phase assignments is generally selected based on the minimum line width that is resolvable and inspectable on a mask. Presently, this is approximately 100 nm depending on the mask writer used. If however, the chromeless transitions (and phase conflicts) are positioned such that they will be cleared by the complimentary trim mask, the defects on the phase edge are not as important from an inspectability standpoint.

Further, in some embodiments, the chromeless phase transitions can be viewed as a method of further shrinking IC die size. Thus, more features, e.g. transistors, can be produced in a smaller area. This increases the number of chips per wafer and ultimately can provide significant cost savings/profit improvements. In one embodiment, the design rules for placing phase shifters are modified to eliminate the spacing requirement of 100 nm (or other distance depending on the particular process technology and mask writing equipment requirements) and thus more features can be defined using phase shifting masks and further those features can be more densely packed. Whether or not chromeless phase transitions are "preferred" vs. used only where needed may be user controllable depending on the configuration of the software defining the phase shifting layouts. However, as more fully described below, the chromeless approach may result in artifacts that cannot be easily removed using the binary trim mask.

Figure 8:
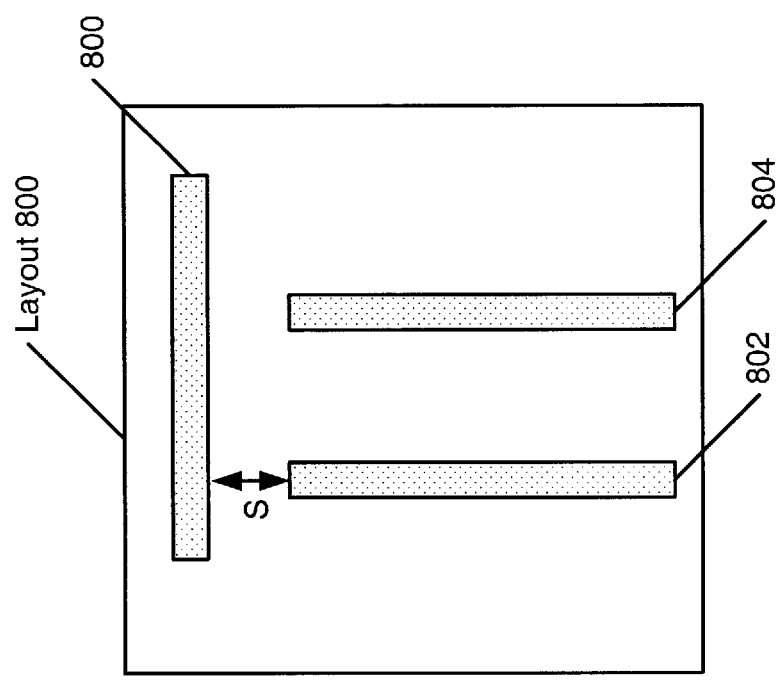
FIG. 8 illustrates a portion of a design layout for an IC.

Turning to FIG. 8, a portion of a layout for an IC is shown. The layout 800 includes three features, the feature 800, the feature 802 and the feature 804. The spacing between the top edge of the feature 802 (and the feature 804) and the bottom edge of the feature 800 is S. Recall, that in one embodiment, phase shifters are placed with a minimum width of $0.8\lambda$, where $\lambda$ is the wavelength of the light used. In discussing FIGS. 8–10 a $\lambda=193$ nm process technology will be considered. Returning to layout 800 in FIG. 8, if the amount of space, S, between the features is less than $0.8\lambda$, 160 nm for our exemplary 193 nm process, then embodiments of the invention select not to define the feature 800 using phase shifting. However, if $S=0.8\lambda$, or is only slightly greater than it, there is the possibility of defining the feature using phase shifting, but there will be inadequate room for a protective chrome (which improves mask manufacturability and inspectability) between a phase shifter placed below the feature 800 and any phase shifters being used to define the feature 802 and the feature 804. Further, the close optical proximity may result in artifacts caused by phase conflicts to appear on the final IC.

Figure 9:
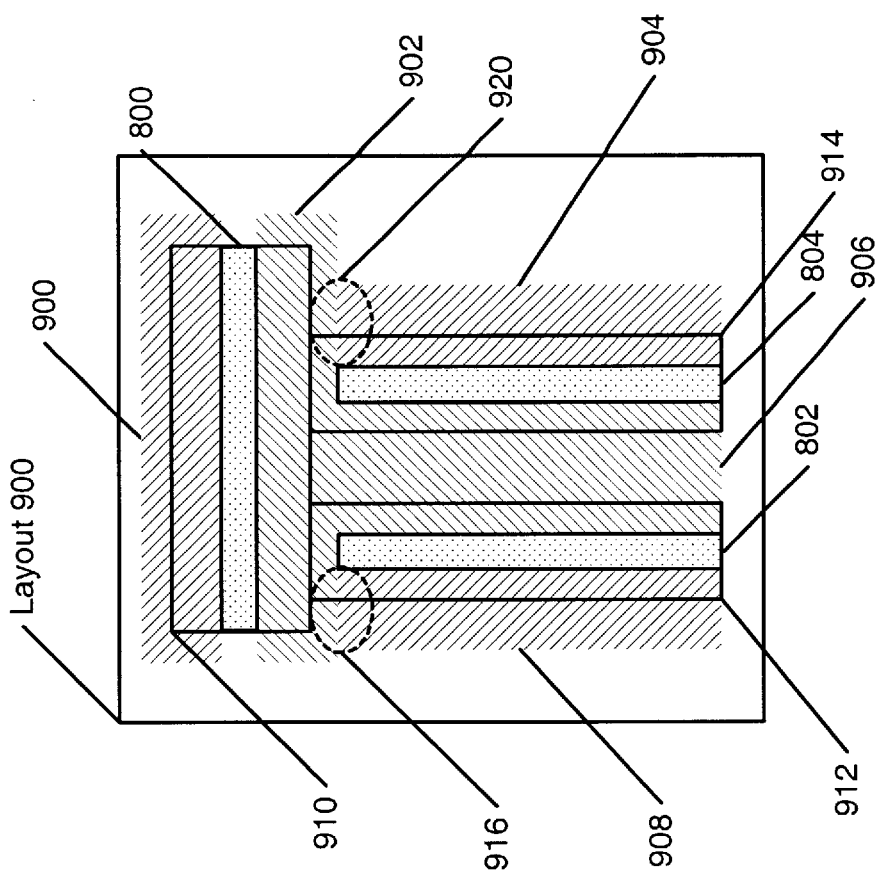
FIG. 9 illustrates a phase shifting layout for the layout of FIG. 8.

Turning to FIG. 9 a proposed dark field phase shifting layout that uses chromeless phase transitions is shown (dark field of background not shaded for clarity). Specifically, FIG. 9 shows a layout 900 that has phase shifters 900, 902, 904, 906, and 908. The phase shifters are light transmissive regions designed to have the light shone through exit at a predetermined phase, e.g. 0 and π. The other elements of FIG. 9 are shown to assist in comprehension of the phase shifting layout. Specifically, the features 800, 802, and 804 are shown. In some embodiments, the bar composed of the mask substrate, a protective material such as chrome, of a narrower width than the features will separate the phase shifters (not shown). Note that in some embodiments the phase shifting layout will be fabricated as a dark field mask therefore there will be protective material by "default" between the phase shifters unless the phase shifters directly abut one another. Additionally, outlines for a trim mask are shown as solid lines around the features, trim mask outlines 910, 912, and 914. Lastly, two phase conflict areas are highlighted with dashed ovals, phase conflicts 916 and 920.

Figure 10:
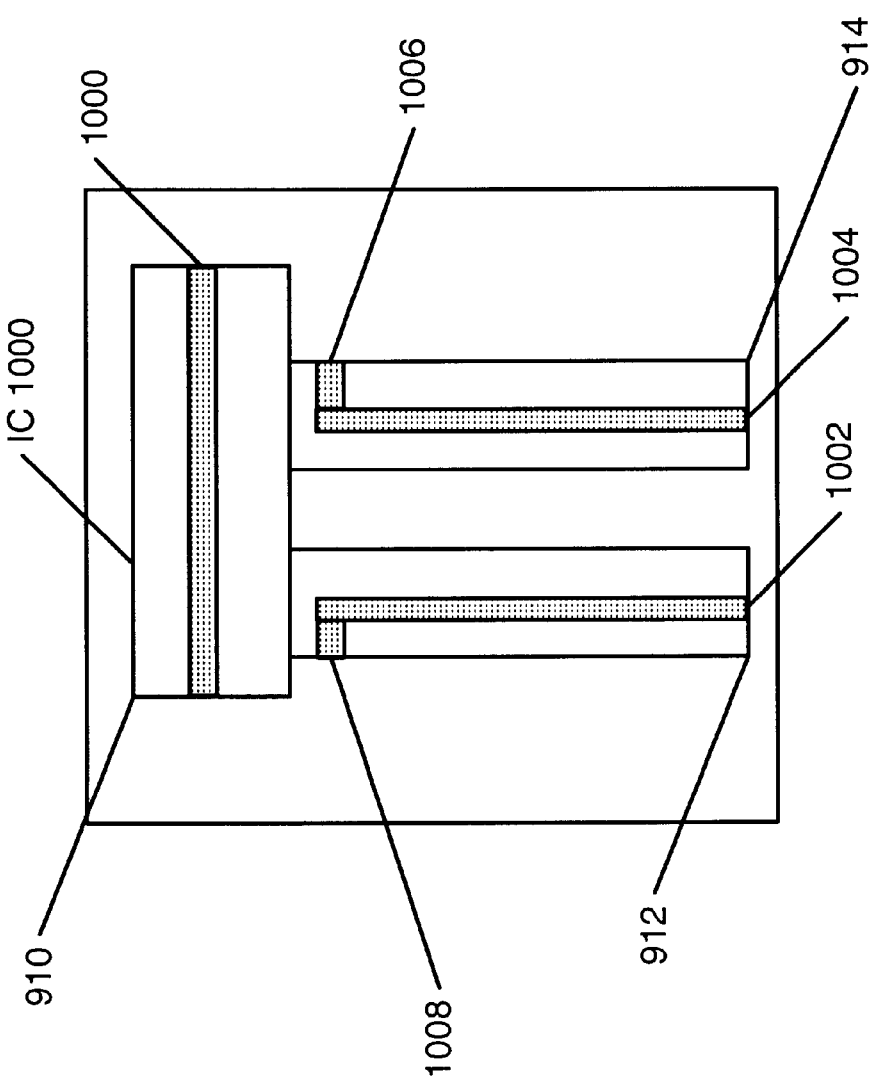
FIG. 10 illustrates a portion of a layer of material in an IC produced using a mask defined by the phase shifting layout of FIG. 9.

The phase conflict areas will result in additional structures being defined in the layer of material if the mask described by the layout is ultimately used without correction, e.g. by the corresponding binary trim mask. Further, some of those additional structures, or artifacts, are not possible to clear with the corresponding trim mask. Turning to FIG. 10 a portion of a layer of material in an IC produced using a mask defined by the phase shifting layout of FIG. 9 together with the corresponding binary trim mask. (Alternatively, FIG. 10 can represent the output of a suitable lithography simulation program.). The features produced by the phase shifting layout 900 together with the corresponding binary trim mask are shown as the features 1000, 1002, and 1004. The outline of the binary trim mask is shown as well as outlines 910, 912, and 914. Notably, because trim mask covered a portion of the phase conflict areas 916 and 920 (see FIG. 9), some artifacts remain on the finished IC, artifacts 1006 and 1008. The designer may have to decide for herself/himself if those artifacts are acceptable in the context of a particular design. In this case, the artifacts are acceptable and the IC can be used. If the resultant artifacts are unacceptable, then chromeless phase transitions cannot be used as shown for the layout 800. Some embodiments of the invention, include software capable of showing a simulation view or schematic view of the type shown in FIG. 10 to assist the designer in understanding the consequences of using a proposed phase shifting layout having chromeless phase transitions.

In some instances, the artifacts could be removed through more complex designs of the binary trim mask. However, such a complex design may itself be difficult to manufacture, interfere with the insertion of OPC features, and/or simply not provide sufficient benefit relative to the complexity and manufacturability problems created.

Figure 11:
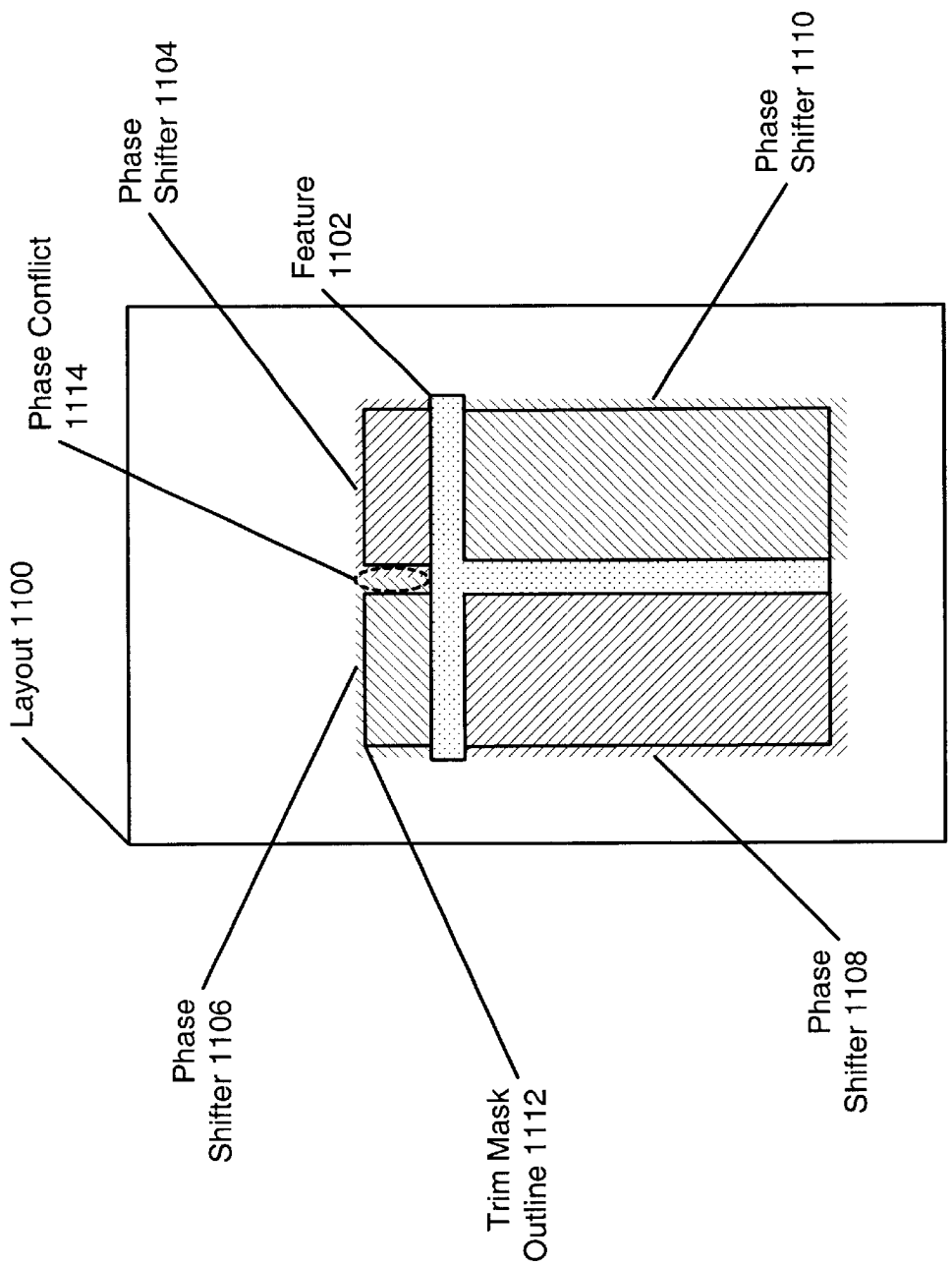
FIG. 11 illustrates a phase shifting layout for a portion of an IC.

FIG. 11 shows a proposed phase shifting layout for a T-structure that uses chromeless phase transitions to define the T-structure. More specifically, FIG. 10 shows a layout 1000 including phase shifters 1104, 1106, 1108, and 1110. The original T-structure of the layout is shown as the feature 1102. The trim mask outline 1112 is also shown. Note however, that a phase conflict 1114 (shown as dashed oval) between the phase shifter 1104 and the phase shifter 1106 exists over the location of the chromeless phase transition.

Importantly, the distance between the edges of the trim mask outline 1112 in the area of the phase conflict 1114 need only be the minimum wafer resolvable space for the binary mask, $S_b$. In one embodiment, for an exemplary $\lambda=193$ nm process, $S_b$ might be 120 nm. Thus, it is possible to place phase shifters in close proximity, and without a phase transition, provided that the binary mask (through an absence of protect) can erase the artifacts of the chromeless phase transition in the area. This also highlights the fact that it in the circumstances where chromeless phase transitions are allowed, inspectability of the mask for defects at the edges of the transition is not important.

Alternative Embodiments

Figure 1:
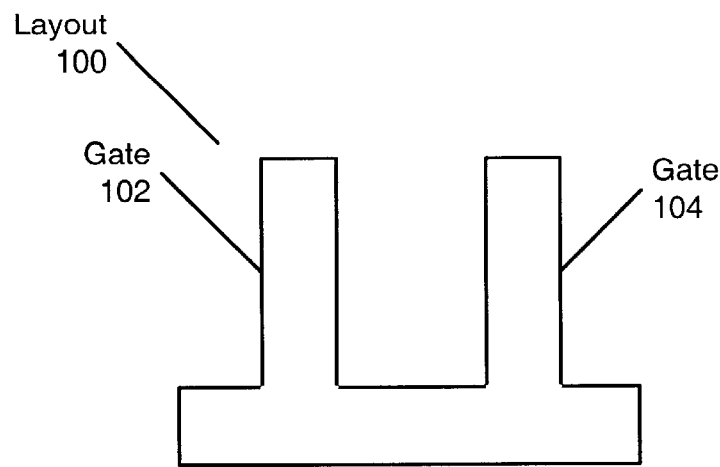
FIG. 1 illustrates a portion of a design layout for an integrated circuit (IC).
Figure 2:
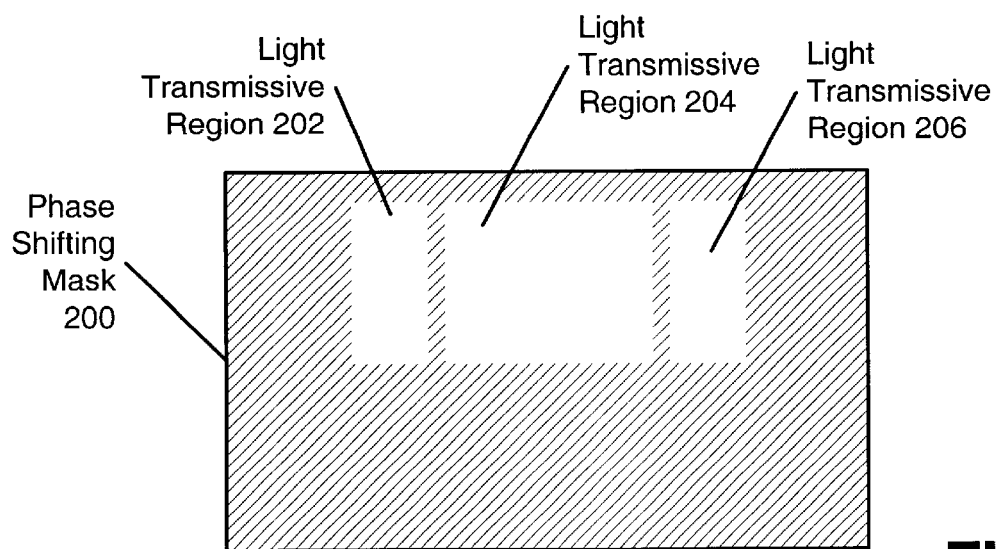
FIG. 2 illustrates a phase shifting mask to define the gates of the layout of FIG. 1.

Although the discussion has focused on defining features using phase shifting masks it may also be desirable to also perform optical proximity correction (OPC) on the provided layout. More specifically, OPC in the context of a layout generally refers to the addition of subwavelength features such as hammerheads, endcaps, and serifs to a design. Returning to the layout 100 of FIG. 1. Light will diffract around the edges of protective areas of a mask. For example, in printed exposure of a binary mask for the layout 100, the top edge of the gate 102 might be shortened or pulled in. Adding OPC to the gate 102, e.g. a hammerhead, will allow the gate 102 to print more clearly. OPC can be integrated into the process 500 or can be separately performed. (Note, similar OPC could be performed for the gate 104.)

In some embodiments, defining gates at subwavelength sizes is referred to as "shrinking" gates. This colloquialism comes about because it reflects the size correspondence between regularly produced features and phase shifting mask-produced features.

Although the term "artifact" is used to refer to the structures that result from use of a phase shifting mask with false 0/180 conflicts (prior to erasure with a corresponding trim mask) other terms may be used as well. For example, the artifacts can also be consider non-structural areas, design violation areas (e.g. because they might fail a design rule check as too close, too tiny, etc), structures, artifacts of phase areas, and/or other suitable terms.

Embodiments of the invention can be used with deep ultraviolet (DUV), extreme ultraviolet (EUV), x-ray, and/or other lithography techniques. The particular mask substrate and protective areas should be adapted for the specific lithographic process.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated).

For example, the transmission medium may include a communications network, such as the Internet. In one embodiment, the computer readable storage medium includes one or more computer programs for identifying critical features, defining phase shifters for critical and/or preferred critical features, identifying conflicts between phase shifters and structures, selecting strategies for resolving conflicts, and/or resolving conflicts. In one embodiment, the electromagnetic waveform comprises computer programs accessed over a network, the computer programs for identifying critical features, defining phase shifters for critical and/or preferred critical features, identifying conflicts between phase shifters and structures, selecting strategies for resolving conflicts, and/or resolving conflicts.

In one embodiment, the electromagnetic waveform comprises computer data corresponding to a layout prepared according to the process 500. In one variation of this embodiment, the computer data is formatted according as one or more GDS-II data files. For example, the computer data could be the output of the process 500 being accessed across a network by mask data preparation software, e.g. CATS from Transcription Enterprises, Inc., a Numerical Technologies Company. In other embodiments, the electromagnetic waveform includes a computer program accessed across the network for selectively adding false phase conflicts to mask definitions for preparing layers of an integrated circuit.

The foregoing description of embodiments of the invention has been provided for the purposes of illustration and description. It is not intended to be exhaustive or to limit the invention to the precise form disclosed. Many modifications and variations will be apparent. The embodiments were chosen and described in order to best explain the principles of the invention and its practical application, thereby enabling others to understand the invention for various embodiments and with various modifications as are suited to the particular use contemplated. It is intended that the scope of the invention be defined by the following claims.

I claim:

1. A method for producing phase shifting layout data from a portion of an integrated circuit (IC) layout, the method comprising:
    identifying a feature in the IC layout for definition with a phase shifting layout using a computer;
    generating the phase shifting layout data using the IC layout, the phase shifting layout data defining phase shifting areas in an opaque field for defining the feature in the material using a computer, the phase shifting layout adapted to be used in conjunction with a second layout data, the second layout data defining other structure in the material, and preventing erasure of the feature;
    determining using a computer if a conflict exists when assigning phase to phase shifting areas in the phase shifting layout data; and
    modifying the phase shifting layout data to resolve the conflict by inserting at least one chromeless phase transition in a phase shifting area of the phase shifting layout data.

2. The method of claim 1, wherein the inserting the at least one chromeless phase transition further comprises subdividing a phase shifting area in the phase shifting layout data into a first phase shifting area and a second phase shifting area, the first and second phase shifting areas having different phase assignments.

3. The method of claim 1, further comprising defining the second layout data such that the area exposed due to the inserting at least one chromeless phase transition will be exposed.

4. The method of claim 1, wherein exposure of a layer of material using the phase shifting layout data without use of the second layout data will result in at least one artifact, the at least one artifact not present in the portion of the IC layout.

5. A phase shifting mask for a portion of an integrated circuit (IC) layout comprising a plurality of features, the phase shifting mask comprising a plurality of light transmissive regions in an opaque field, each light transmissive region in the plurality of light transmissive regions permitting passage of light of a first wavelength at either a first phase or a second phase, and wherein the plurality of light transmissive regions includes a first light transmissive region and a second light transmissive region such that
    the plurality of light transmissive regions define the plurality of features in the IC layout;
    the first light transmissive region permits the passage of light at the first phase and the second light transmissive region permits the passage of light at the second phase;
    the first light transmissive region and the second light transmissive region have a shared boundary so as to cause destructive interference that would produce an artifact in a layer of material; and
    wherein a binary mask designed for use in conjunction with the phase shifting mask will prevent the artifact from remaining in a resultant integrated circuit.

6. A dark field mask having phase areas for defining at least a portion of an integrated circuit (IC) layout, the phase areas being defined using the following process:
    defining phase regions in the dark field mask for use in defining structures of the IC layout;
    identifying a conflict preventing assignment of phase to the phase regions;
    inserting at least one false phase area directly abutting another phase area in the dark field mask to resolve the conflict;
    defining a corresponding trim mask to remove artifacts created by use of the dark field mask having the at least one false phase area.

7. The dark field mask of claim 6, wherein due to the inserting, the dark field mask produces a false structure when used to expose a layer of material, the false structure not in the IC layout.

8. The dark field mask of claim 6, wherein the false phase area comprises a non-structural phase area, the non-structural phase area acting in conjunction with the phase areas to produce at least one artifact when the dark field mask used to expose a layer of material.

9. The dark field mask of claim 6, wherein the inserting further comprises at least one of selecting area with the highest process latitude, area the largest open region, and area where easiest to remove artifacts, for placement of the false phase area.

10. An electromagnetic waveform, the electromagnetic waveform comprising a computer program for producing phase shifting layout data from a portion of an integrated circuit (IC) layout, the computer program further comprising:
    a first set of instructions for identifying a feature in the IC layout for definition with a phase shifting layout using a computer;
    a second set of instructions for generating the phase shifting layout data using the IC layout, the phase shifting layout data defining phase shifting areas in an opaque field for defining the feature in the material using a computer, the phase shifting layout adapted to be used in conjunction with a second layout data, the second layout data defining other structure in the material, and preventing erasure of the feature;
    a third set of instructions for determining using a computer if a conflict exists when assigning phase to phase shifting areas in the phase shifting layout data; and
    a fourth set of modifying the phase shifting layout data to resolve the conflict by inserting at least one chromeless phase transition in a phase shifting area of the phase shifting layout data.

11. The electromagnetic waveform of claim 10, wherein the electromagnetic waveform comprises a computer program accessed over a network.

12. The electromagnetic waveform of claim 10, wherein the computer program further comprises a fifth set of instructions for defining the second layout data.

13. The electromagnetic waveform of claim 10, wherein the fourth set of instructions further comprises a set of instructions for selecting a location for the at least one chromeless phase transition using one or more of the following criteria: largest phase shifting region, phase shifting region having greatest process latitude, and ease of removal of artifacts created by the at least one chromeless phase transition using the second layout data.

14. The electromagnetic waveform of claim 10, wherein the third set of instructions further comprises a fifth set of instructions for modeling phase assignment as a coloring problem and wherein a conflict exists if the coloring problem not solvable.

15. The electromagnetic waveform of claim 14, wherein the fifth set of instructions further comprises a sixth set of instructions for modeling the coloring problem using a graph describing coloring dependencies and wherein the coloring problem not solvable if an odd length cycle exists in the graph.

16. An apparatus for defining a dark field mask having phase areas for at least a portion of an integrated circuit (IC) layout, the apparatus comprising:

means for defining phase regions in the dark field mask for use in defining structures of the IC layout;

means for identifying a conflict preventing assignment of phase to the phase regions;

means for inserting at least one false phase area directly abutting another phase area in the dark field mask to resolve the conflict;

means for defining a corresponding trim mask to remove artifacts created by use of the dark field mask having the at least one false phase area.

17. The apparatus of claim 16, wherein the means for identifying a conflict further comprises means for representing phase assignments as a coloring problem of assigning a color of either 0 or π to each phase area, and wherein a conflict is identified if the coloring problem not solvable.

18. The apparatus of claim 16, wherein the means for defining a corresponding trim mask further comprises means for ensuring that area of the corresponding trim mask corresponding to location of artifacts produced by the dark field mask have an absence of protective material.

19. The apparatus of claim 16, wherein the fourth means for inserting further comprises means for selecting a location for the at least one false phase area using one or more of the following criteria: largest phase shifting region, phase shifting region having greatest process latitude, and ease of removal of artifacts created by the at least one false phase area using the corresponding trim mask.

20. The apparatus of claim 16, wherein the wherein artifacts created by use of the dark field mask comprise non-structural area created in a layer of material by use of the dark field mask.

21. The apparatus of claim 16, wherein the wherein artifacts created by use of the dark field mask comprise design violation area created in a layer of material by use of the dark field mask.

22. A method for producing phase shifting layout data from a portion of an integrated circuit (IC) layout, the method comprising:

identifying a feature in the IC layout for definition with a phase shifting layout using a computer;

generating the phase shifting layout data using the IC layout, the phase shifting layout data defining phase shifting areas in an opaque field for defining the feature in the material using a computer, the phase shifting layout adapted to be used in conjunction with a second layout data, the second layout data defining other structure in the material, and preventing erasure of the feature, and wherein there is a chromeless phase transition in the phase shifting layout data between a first and a second phase shifting area in the phase shifting layout data; and assigning phase to phase shifting areas in the phase shifting layout data while allowing phase assignment conflicts between the first and second phase shifting areas.

23. The method of claim 22, wherein the chromeless phase transition corresponds to a phase transition where is an absence of protective material in the mask between the first and second phase shifting area.

24. The method of claim 22, wherein usage of the phase shifting layout data in conjunction with the second layout data results in artifacts in the finished IC.

25. The method of claim 22, wherein the first phase shifting area has a shifter width approximately equal to the minimum allowable shifter width.

26. The method of claim 25, wherein minimum allowable shifter width is a predetermined multiple of the wavelength of light ($\lambda$).

27. The method of claim 25, wherein minimum allowable shifter width is a 0.8 the wavelength of light ($\lambda$).

28. The method of claim 22, wherein the chromeless phase transition position in an area where spacing between edges of trim in the corresponding second layout data approximately equal to minimum resolvable space for a binary mask.

29. A method of phase shifting a layout, the method comprising:

identifying a phase conflict caused by two sets of features interlaced within an active region of the layout, wherein placement of shifters for defining gate portions of the two sets of features generates a phase conflict; and resolving the phase conflict by dividing at least one shifter within the active region into at least two shifters with different phase.

30. The method of claim 29, wherein resolving the phase conflict includes:

determining an area of each shifter; and dividing the largest shifter.

31. The method of claim 29, wherein resolving the phase conflict includes:

determining a process latitude for each shifter; and dividing the shifter with the greatest process latitude.

32. The method of claim 29, wherein resolving the phase conflict includes:

determining ease of removal of an artifact caused by dividing each shifter; and dividing the shifter providing the greatest ease of removal.

33. The method of claim 29, wherein the at least two shifters directly abut each other.

34. The method of claim 29, wherein dividing the shifter includes providing a chromeless phase transition.

* * * * *